United States Patent [19]

Andrews, Jr. et al.

[11] Patent Number: 4,626,056
[45] Date of Patent: Dec. 2, 1986

[54] CARD EDGE CONNECTOR

[75] Inventors: Howard W. Andrews, Jr., Hershey; Clifford F. Bobb, Carlisle; Attalee S. Taylor, Palmyra, all of Pa.

[73] Assignee: AMP Incorporated, Harrisburg, Pa.

[21] Appl. No.: 785,109

[22] Filed: Oct. 7, 1985

Related U.S. Application Data

[63] Continuation of Ser. No. 581,635, Feb. 21, 1984, abandoned.

[51] Int. Cl.⁴ .................................. H01R 13/62
[52] U.S. Cl. .................. 339/75 MP; 339/176 MP
[58] Field of Search .............. 339/17 F, 74 R, 75 MP, 339/176 MP, 176 MF

[56] References Cited

U.S. PATENT DOCUMENTS

| | | | |
|---|---|---|---|
| 3,102,767 | 9/1963 | Schneck | 339/176 |
| 3,401,369 | 9/1968 | Palmateer et al. | 339/17 |
| 3,526,869 | 9/1970 | Conrad et al. | 339/75 MP |
| 3,568,134 | 3/1971 | Anhalt et al. | 339/75 MP |
| 3,609,463 | 9/1971 | Laboue | 339/17 LM |
| 3,614,707 | 10/1971 | Kaufmann et al. | 339/17 F |
| 3,922,054 | 11/1975 | Dechelette | 339/75 MP |
| 3,982,807 | 9/1976 | Anhalt et al. | 339/75 MP |
| 4,080,027 | 3/1978 | Benasutti | 339/75 MP |
| 4,169,644 | 10/1979 | Bonhomme | 339/75 MP |
| 4,560,221 | 12/1985 | Olsson | 339/176 MP |

Primary Examiner—John McQuade
Attorney, Agent, or Firm—Allan B. Osborne

[57] ABSTRACT

The present invention relates to zero insertion force card edge connectors with flexible film providing the interconnecting medium and with improvements to cam means so as to obtain accurate alignment and keying capabilities required in such high density connectors.

47 Claims, 3 Drawing Figures

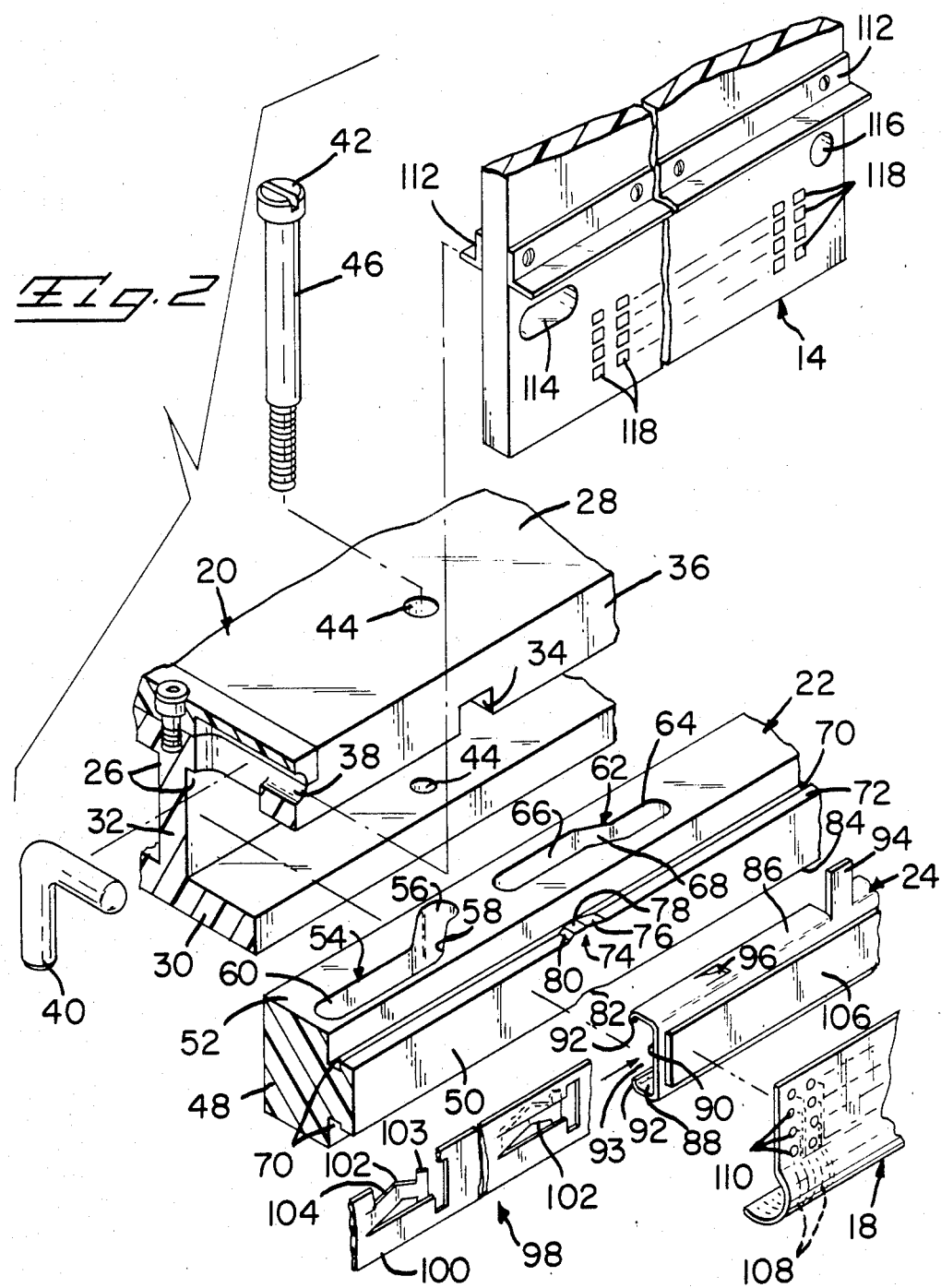

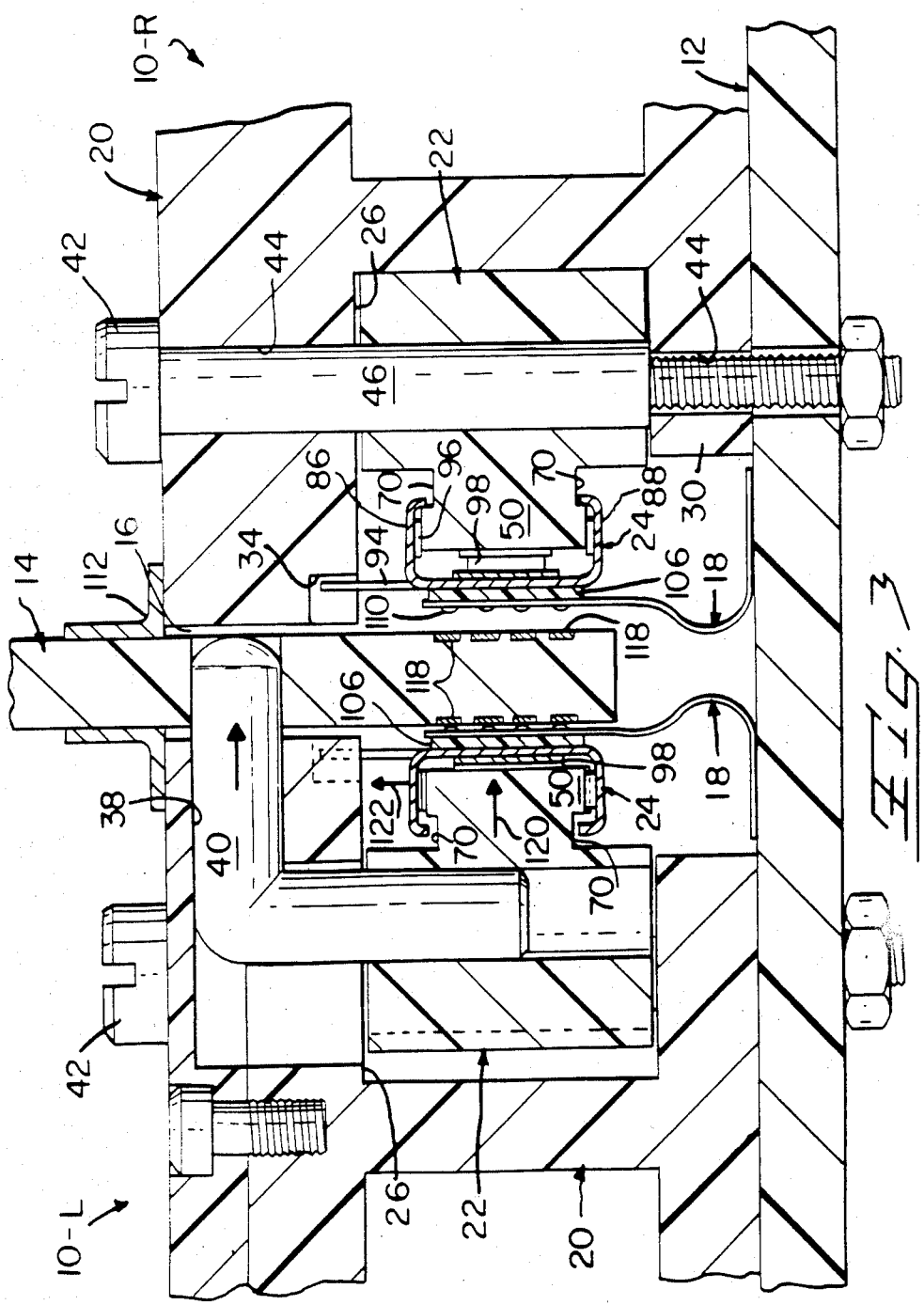

CARD EDGE CONNECTOR

This application is a continuation of application Ser. No. 581,635 filed Feb. 21, 1984 now abandoned.

The use of flexible film, i.e., printed circuitry on thin insulating material such as polyester film, to interconnect daughter cards to mother boards provides a means to achieve extremely high density interconnections. Connectors using such film are known from several patents dating back to the early 1960's. U.S. Pat. No. 3,102,767 is one such disclosure. Subsequently issued patents include U.S. Pat. No. 3,609,463 wherein a spring biased push member is utilized to urge the contacts on a flexible material against an inserted card. In this and other disclosures, e.g., U.S. Pat. No. 3,401,369, the card is inserted against the biased film, i.e., an insertion force is required.

Workers in the field are now conceptualizing and experimenting with including zero insertion force and wipe in connectors of the above types. However there are difficulties associated with this advancement in the art, e.g., flexible film is more readily susceptible to damage, particularly with respect to the circuits printed thereon and mounting the film to the back panel or mother board at one end and to the connector at the other end. Alignment problems which are present in conventional card edge connectors are at least as big if not a bigger problem in these new type connectors.

It is now intended to provide improvements to a card edge connector of the type described in the immediately preceding paragraph. These improvements simplify the aforementioned problems as well as others.

A zero insertion force, flexible film connector having a slot to receive a printed circuit card, a cam and cam follower to move the flexible film into and out of the slot is, according to the present invention, characterized in having a slidably mounted, L-shaped keying pin with a first leg extending towards the slot and the second leg positioned in a slot in the cam so that, by moving the cam, the first leg slides into the slot and into a hole in a card which may be therein to lock the card in proper registration with the flexible film.

For a better understanding of the invention, reference will now be made by way of example to the accompanying drawings in which:

FIG. 2 is an exploded view of one side of the connector of FIG. 1; and

FIG. 3 is a sectional end view of the connector of FIG. 1 showing one side open and the other side closed.

Figure 1:
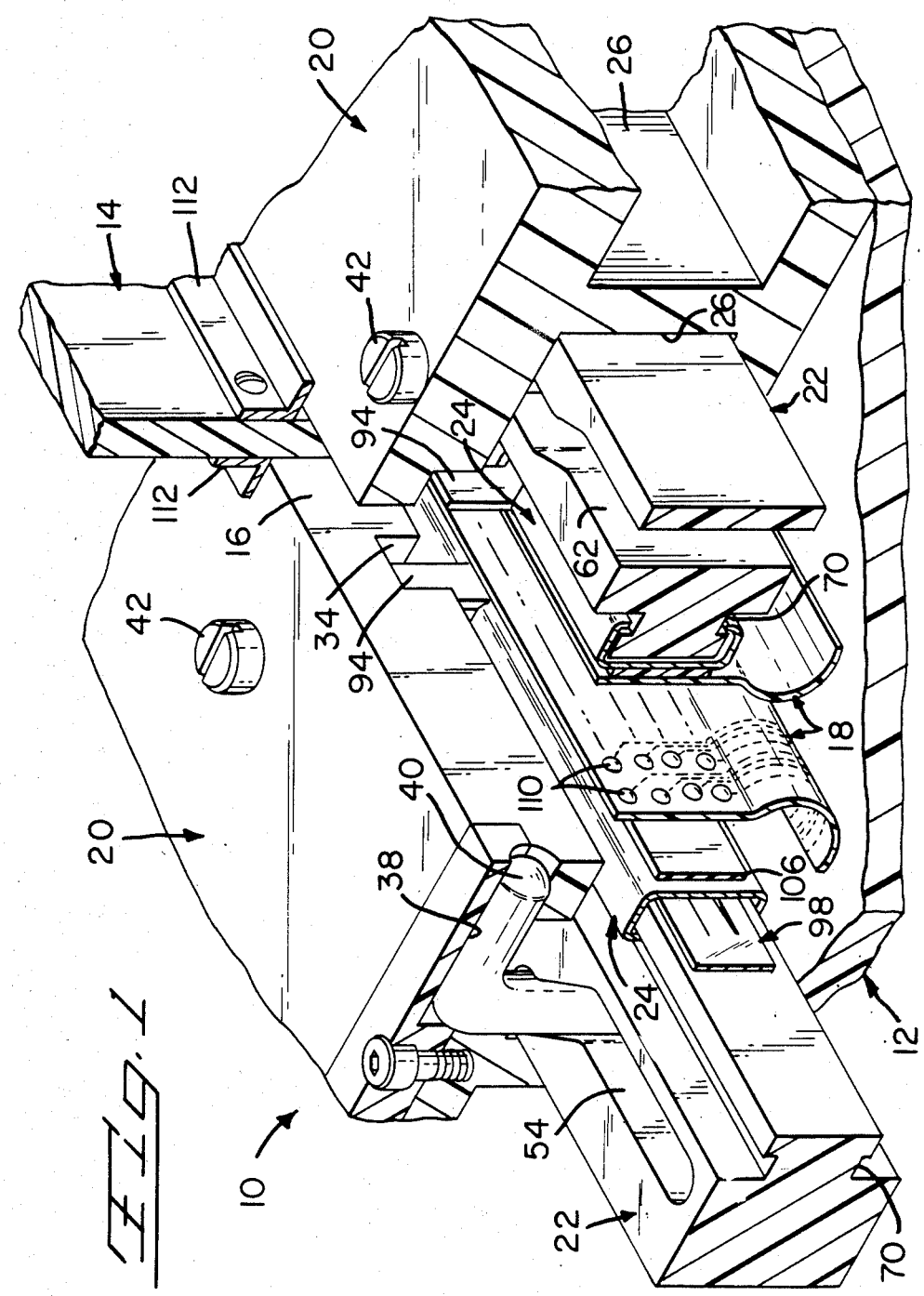
FIG. 1 is an isometric, partly sectioned view of the card edge connector of the present invention.

FIG. 1 shows a connector 10 mounted on a back panel or mother board 12. The connector receives daughter card 14 in card edge receiving slot 16 and connects the circuitry thereon to the circuitry on the board through printed circuitry on a strip of flexible film 18.

The major components of connector 10 include housing 20, cams 22 and cam followers 24. If the circuitry is on one side only of card 14, connector 10 would include one housing, one cam and one follower (plus certain supporting structures, not shown). The embodiment shown is for cards with circuitry on both sides and accordingly have two housings, two cams and two followers.

Housings 20 are made with a channel 26 running down each side. This design enables one housing to be used for two adjacent connectors.

As seen better in FIG. 2, the channel defines upper and lower side walls 28 and 30 respectively, and vertical or back wall 32. Notches 34 are provided along the free edge 36 of upper side wall 28. Keying pin recesses 38 (only one is shown) are provided near each end of the upper side wall. The recess opens out onto edge 36 and also into channel 26 with the latter opening being somewhat elongated. The one keying pin 40 shown adjacent the recess in FIG. 2 is L-shaped so that one leg extends into the channel when it is positioned in the recess.

Each housing is fastened to the panel or board by bolts 42 which pass through openings 44 in the two side walls and through the channel. These bolts (the number is contingent upon the length of the connector which can be of any desired length) have a shaft or shoulder portion 46 which is long enough to span channel 26.

Housings 20 may be molded from a suitable plastic or made from metal such as steel. In the latter case, one method of providing recesses 38 is suggested in the drawings, i.e., milling out the recess and capping it.

Cam 22 will now be described with continuing reference to FIG. 2. The cam is an elongated, rectangular block 48 with a rail 50 on one side thereof. Two sets of camming slots are provided in the upper surface 52 of the block. One set includes two such slots, one of which is shown and indicated by reference numeral 54. These slots, which receive one leg of pin 40, have a short first parallel section 56, a short oblique section 58, and a long second parallel section 60. These slots are located adjacent each end of the cam.

The second set of cam slots, again only one is shown, is indicated by reference numeral 62. These slots extend completely through block 52 and receive therethrough bolt 42, i.e., the shoulder portion 46. These slots have a first parallel section 64 which is offset from a second parallel section 66 by oblique section 68. The length of first parallel section 64 is equal to the combined length of sections 56 and 58 of cam slot 54. The reason therefor will be pointed out below.

Rail 50 is thin, rectangular, and connected to the block such as to define upper and lower grooves 70 therebetween. The upper side 72 of the rail is provided with ramps 74. These ramps include a long slope 76, a flat portion 78, and a steep slope 80. Cut-outs or recesses 82, having the identical shape, are provided on the lower side 84 of the rail and in precise alignment with the ramps. The ramps and recesses are spaced along rail 50 as required.

Cam followers 24 may be stamped and formed from steel. These channel-shaped members are formed with upper and lower side walls 86 and 88 respectively and joined by base wall 90. The free ends of each side wall are turned in as indicated by reference numeral 92. The walls define channel 93. Tabs 94 are struck from the upper side wall 86 and bent to extend upwardly. The number and spacing of the tabs correspond to the number of spacing of notches 34 in housing 20. Ramp following fingers 96 are stamped and formed from the upper side wall and are pushed into the channel defined in part by the side walls. Identical fingers (not shown) are provided on the lower side wall 88.

Followers 24 include biasing means 98 which are secured to the inner surface of base wall 90. The preferred means are shown exploded out of the follower in FIG. 2 and include an elongate plate 100 with cantilever beams 102 spaced therealong. The beams have ears 103 on the free ends and are bent into a concave-convex shape with the convex surface 104 facing out of the follower. The plates may be secured to the base wall by riveting, adhesive, or other similar conventional means.

An elastomeric pad 106 is secured to the outer surface of base wall 90 as shown.

The preferred flexible film strip 18 for use with connector 10 is one with the circuitry embedded between insulating layers and connected to pads which project out from the surface. Such a film strip is shown in FIG. 2 with the embedded circuitry shown as dashed lines and indicated by reference numeral 108. The pads or buttons are indicated by reference numeral 110.

FIG. 2 also includes daughter card 14 to show stop members 112 attached thereto and keying holes 114 and 116. The former is elongated while the latter is circular. Circuit pads 118 on the card provide the contact surface for pads 110 on film 18. The board 12 has similar conductive pads as is well known by those skilled in the art.

At the present time, the method of assembling connector 10 includes flexible film 18. The circuit pads or circuits themselves on one edge of each of the two film strips are soldered or otherwise secured to board 12. The other edges are secured to the elastomeric pads 106 on followers 24. The cams 22 are assembled to the followers by sliding rails 50 into channels 93. The turned-in free edges of the side walls catch in grooves 70. The housing is added by sliding it onto cam 22, i.e., the cam is received into channel 26. During this step (lower side wall 30 on the housing is supported by the board) tabs 94 enter notches 34 as shown in FIG. 1. Bolts 42 are placed in openings 44 and threaded into appropriate receivers on the opposite side of the board. Cam 22 is concurrently captured in channel 26 thereby. Locating pins 40 are placed in the recesses 38 and cam slots 54 and confined by the caps. The connector halves, i.e., one housing with cam, follower and attached film, are spaced apart a distance such that a card can be inserted without engaging films 18. The right-hand connector half, indicated generally by reference numeral 10-R in FIG. 3, illustrates this. Stop members 112 automatically limit the insertion depth so that circuit pads 118 on the card are in line with conductive buttons 110 on film 18.

The left-hand connector half, indicated by reference numeral 10-L in FIG. 3, shows the film pressed against card pads 118, i.e., the connector half has been closed by sliding cam 22 longitudinally along channel 26. The sequence of events is, first, keying pins 40 are cammed out into keying holes 114 and 116. The pin in the latter hole holds the card against movement in any direction. The pin in the former hole, i.e., hole 114, holds the card against vertical movement but does allow some horizontal growth or shrinkage induced by thermal forces. Due to the structure of cam slots 54 and 62, the keying pins are required in the keying holes in the card before the next event takes place. This insures that the card is held securely. The next event is caused by the interaction of cam slot 62 and bolt 42 or, more precisely, shoulder portion 46 thereon. The cam is forced to move in towards the card as indicated by arrow 120. As the buttons 110 on the film must touch pads 118 on the card, the long slope 76 on ramps 74 engage fingers 96 forcing follower 24 upwardly as indicated by arrow 122. This movement provides upward wipe. The cam moves further in, with the follower riding across the top of the ramps. With further longitudinal travel, the short slope 80 on the ramps move past fingers 96 and the beveled recess wall engages the fingers to force the follower down, dragging button 110 with it to provide a back wipe across pads 118. At this point cam 22 has been cammed in to its predetermined distance. Buttons 110 are forced against pads 118 with the predetermined amount of force which preferably is about 80 grams.

Although cam 22 is moving both longitudinally and inwardly, tabs 94 on follower 24 hold it against longitudinal travel while permitting it to move perpendicularly.

Elastomeric pad 106, in addition to providing insulation between the film and follower, providing compensation for variations of card thicknesses and even for thickness differences between adjacent pads 118.

Biasing means 100 provide resiliency against forces attempting to introduce changes in the normal forces pushing the film against the card. Further, the resiliency compensates for variations in thicknesses of the cards. In this regard, as the cam is moving in, the cantilever beams are being pressed in until ears 103 bear against plate 100. The nature of the beams change to beams secured at both ends and require substantially greater pressure than is available to further compress them. Consequently, any relaxation in the cam is taken up by the beam returning towards its original shape and the normal forces at the contacting surfaces (buttons 110 and pads 118) remain constant.

Moving cam 22 longitudinally in the opposite direction reverses the aforementioned steps and the card may be withdrawn freely.

The circuit card and film strips have been referred to and illustrated as having pads or buttons. This description and drawings are not intended to limit the use of the connector disclosed herein to that type of circuitry.

We claim:

1. A zero insertion force, card edge connector for interconnecting circuits on a circuit board and on a circuit card by means of circuits on a flexible film where some circuits thereon are attached to circuits on the circuit board and where a free edge of the flexible film extends away from the board, comprising:
    a. a housing for mounting on a circuit board with a card receiving space adjacent thereto, and having cam support means thereon;
    b. an elongated cam slidably mounted on the cam support means for longitudinal travel parallel to the housing and card receiving space;
    c. cooperating means on the housing and on the cam for causing the cam to move laterally towards and away from the card receiving space as the cam moves parallel thereto;
    d. a cam follower having one surface for receiving an edge of a flexible film, the cam follower being mounted on the cam in a sliding relation and with the one surface facing the card receiving space;
    e. cooperating means on the cam and on the cam follower for moving the cam follower away from the circuit board on which the housing may be mounted as the cam moves along the cam support means; and
    f. cooperating means on the housing and on the cam follower to prevent the cam follower from moving parallel to the card receiving space as the cam moves longitudinally but which permits the cam follower to move laterally as the cam moves laterally towards and away from the card receiving space so that circuits on an edge of a flexible film which may be attached to the one surface will engage and disengage with circuits on a circuit card which may be positioned in the card receiving space.

2. The connector of claim 1 further including cooperating means on the cam and on the cam follower for moving the cam follower towards the circuit board on which the housing may be mounted as the cam moves along the cam support means.

3. The connector of claim 2 further including keying means mounted on the housing for engagement with a card which may be in the card receiving space to locate the card in a predetermined position relative to the housing.

4. The connector of claim 1 wherein the housing includes a pair of cam support means with one cam support means being adjacent a card receiving space on each side of the housing to provide a basis for two side by side connectors with each connector adapted to interconnect a separate circuit card to the circuit board.

5. The connector of claim 3 further including biasing means positioned between the cam and cam follower for resiliently biasing the cam follower laterally away from the cam and towards the card receiving space.

6. The connector of claim 2 wherein the cam follower includes side walls and a base wall to define a channel and the cam includes a rail attached to a cam side facing the card receiving space, the cam follower being slidably mounted on the rail with the outside surface of the base wall providing the one surface for receiving an edge of a flexible film.

7. The connector of claim 6 wherein the cooperating means on the cam and cam follower includes fingers on the inside surfaces of the side wall of the cam follower and a ramp on a top edge of the rail raising the cam follower away from the circuit board and a recess in a bottom edge of the rail for forcing the cam follower towards the circuit board.

8. The connector of claim 1 wherein the cam support means includes a channel in the housing opening out laterally towards the card receiving space.

9. The connector of claim 8 wherein the cooperating means on the housing and cam for causing the cam to move laterally includes a shaft secured in the housing and extending through a vertical slot in the cam, said slot having two sections horizontally offset one from the other with both sections being parallel to the card receiving space and a third section extending between and connecting the first two sections.

10. A zero insertion force, card edge connector for interconnecting circuits on a circuit board and on a circuit card by means of circuits on a flexible film where some circuits on one film edge are attached to circuits on the circuit board, and another film edge extends away from the board, comprising:

a. a channel shaped housing for mounting on a circuit board with the channel opening laterally toward a circuit card receiving space adjacent and extending parallel to the housing;

b. an elongated cam slidably mounted in the channel for travel parallel to the card receiving space, said cam having a rail attached to one side thereof and projecting laterally towards the card receiving space;

c. cooperating means on the housing and cam for causing the cam to move laterally towards and away from the card receiving space as it moves parallel thereto;

d. a channel-shaped cam follower having one surface for receiving an edge on a flexible film, the cam follower being mounted on the cam rail and through which the rail sides and with the one surface of the cam follower facing the card receiving space;

e. cooperating means on the rail and on the cam follower to move the cam follower towards and away from the circuit board on which the housing is mounted so that circuits on an edge of a flexible film mounted on the one surface wipes and back wipes across circuits on a circuit card which may be in the card receiving space as the cam moves in the housing channel; and f. cooperating means on the housing and on the cam follower to prevent the cam follower from moving parallel to the card receiving space so that as the cam moves in the housing channel, the cam follower moves laterally towards and away from the card receiving space whereupon circuits on an edge of a flexible film which may be attached to the one surface will be pressed against and withdrawn from circuits on a circuit card which may be in the card receiving space.

11. The connector of claim 10 wherein the cooperating means on the housing and cam include a shaft extending through the channel in a direction perpendicular to the circuit board and through a slot in the cam, the slot comprising two sections parallel to the card receiving space and offset one to the other and a section, oblique to the card receiving space, connecting the parallel sections.

12. The connector of claim 10 wherein the cooperating means on the housing and cam include a shaft extending through the channel in a direction perpendicular to the circuit board and through a slot in the cam, the slot comprising two sections parallel to the card receiving space and offset one to the other and a section, oblique to the card receiving space, connecting the parallel sections.

13. The connector of claim 12 further including keying means mounted in the housing for travel into the card receiving space to engage a circuit card which may be positioned therein to locate the card in a predetermined position relating to the housing.

14. The connector of claim 13 further including engaging means on the keying means engageable by the cam for driving the keying means into the card receiving space upon the cam being moved in the housing channel.

15. The connector of claim 14 wherein the keying means and engaging means thereon include an L-shaped pin slidably mounted in a recess in the housing with a first leg extending laterally towards the card receiving space and a second leg extending into a slot in the cam, said slot comprising short and long sections which are parallel to the card receiving space and are offset relative to each other and a third section which is obliquely positioned with respect to and connects the other sections.

16. The connector of claim 10 wherein the cooperating means on the rail and cam follower include a ramp on a top edge of the rail, a recess located in a bottom edge of the rail and inwardly directed fingers on the side walls defining the channel-shaped cam follower and which follow the surfaces of the ramp and recess to move the cam follower away from and towards the circuit board respectively.

17. The connector of claim 15 wherein the cooperating means on the rail and cam follower include a ramp on a top edge of the rail, a recess located in a bottom edge of the rail and inwardly directed fingers on the side walls defining the channel-shaped cam follower and which follow the surfaces of the ramp and recess to move the cam follower away from and towards the circuit board respectively.

18. The connector of claim 10 wherein the cooperating means on the housing and on the cam follower includes a notch in a side wall defining the channel in the housing and a tab on the cam follower which is received in the notch, said notch and tab being orientated to prevent movement of the cam follower parallel to the card receiving space but not movement perpendicular thereto or perpendicular to the circuit board.

19. The connector of claim 17 wherein the cooperating means on the housing and on the cam follower includes a notch in a side wall defining the channel in the housing and a tab on the cam follower which is received in the notch, said notch and tab being orientated to prevent movement of the cam follower parallel to the card receiving space but not movement perpendicular thereto or perpendicular to the circuit board.

20. The connector of claim 19 further including biasing means mounted between the cam follower and a surface of the rail facing the card receiving space, said biasing means providing resiliency against forces attempting to induce change in the forces being exerted between the circuits on an edge of a flexible film mounted on the one surface and the circuits on a circuit card which may be in the card receiving space.

21. The connector of claim 20 wherein the biasing means include a compressible cantilever beam on a plate with the beam extending obliquely therefrom.

22. The connector of claim 10 wherein the housing includes two channels opening out in opposing directions towards card receiving spaces adjacent each side of the housing to form a basis for two, side by side connectors with each connector adapted to interconnect a separate circuit card to the circuit board.

23. A zero insertion force, card edge connector for interconnecting circuits on a circuit board and on both sides of a circuit card by means of circuits on two flexible film strips with some circuits thereon being attached to circuits on the circuit board and with at least one edge of each strip extending away from the board, comprising:
  a. a pair of elongated housings for mounting on a circuit board with one parallel to the other and with a circuit card slot therebetween;
  b. cam support means on each housing;
  c. cams slidably mounted on each cam support means for longitudinal travel parallel to the card slot;
  d. cooperating means on each of the housings and on the cams for causing the cams to move laterally towards and away from the card slot as the cams move parallel thereto;
  e. a cam follower for each cam having one surface for receiving an edge of a flexible film strip, said cam followers being slidably mounted on the cams with the one surface facing the card slot;
  f. cooperating means on the cams and on the cam followers for causing the cam followers to move away from the circuit board on which the housings may be mounted as the cams move longitudinally; and
  g. cooperating means on each housing and each cam follower for preventing longitudinal travel by the cam followers but which permits them to move laterally as the cams move laterally towards and away from the card slot so that circuits on the edges of flexible film strips which may be attached to the one surface will engage and disengage circuits on a circuit card which may be positioned in the card slot.

24. The connector of claim 23 further including cooperating means on the cams and on the cam followers for causing the cam followers to move towards the circuit board on which the housings may be mounted as the cams move longitudinally.

25. The connector of claim 24 further including keying means mounted on one housing to locate a circuit card which may be in the card slot in a predetermined registration with the one housing.

26. The connector of claim 25 wherein the cam support means includes an elongated channel in the housings which opens out laterally towards the card slot.

27. The connector of claim 26 wherein the cooperating means on each housing and each cam include a shaft extending across the channel and through a cam slot in the cam, the cam slot including two sections which extend parallel to the card slot and which are horizontally offset, one to the other, and a third section which extends obliquely relative to and which connects the other two sections.

28. The connector of claim 27 wherein the keying means include an L-shaped pin with a first leg slidingly supported by the one housing and a second leg extending into a keying slot in the cam positioned in the channel in that housing, the keying slot including a section extending oblique to the card slot so that by moving the cam longitudinally in one direction, the pin moves with the first leg entering the card slot and into a hole which may be located in a circuit card which may be in the card slot.

29. The connector of claim 28 wherein the cooperating means on each housing and on each cam follower includes a notch in one of the side walls defining the housing channel with the notch opening out toward the card slot and a finger on the cam follower which is received in the notch, the side walls thereof preventing the cam follower from moving longitudinally but permitting the cam follower to move laterally towards and away from the card slot.

30. The connector of claim 29 wherein each cam includes a rail attached to the side facing the card slot and each cam follower being channel-shaped through which the rail slides.

31. The connector of claim 30 further including grooves between the rail and side of the cam and the free edges of the side walls defining the channel of the cam followers being turned inwardly and received in the grooves to slidably attach the cam followers to the rails.

32. The connector of claim 31 wherein the cooperating means on the cams and cam followers include ramps on a top edge of the rails, recesses in a bottom edge of the rails and inwardly directed fingers on the side walls of the cam followers which cooperate with the ramps to move the cam followers away from the circuit board and with the recesses to move the cam followers towards the circuit board.

33. The connector of claim 32 further including biasing means positioned between the rail and each cam follower for resiliently biasing the cam follower towards the card slot.

34. The connector of claim 33 further including a resilient pad on the one surface of each cam follower.

35. The connector of claim 34 wherein the biasing means include cantilever beams.

36. The connector of claim 35 further including support means to be attached to circuit card and supported by the two housings so that a card to which the support means may be attached extends into the card slot.

37. The connector of claim 27 further including a second L-shaped pin spaced from the first pin and a second keying slot in the cam to receive a second leg on the second pin and wherein the first leg on the second pin is smaller than needed to be received in a second hole in a card so that the positioning of that first leg in that second hole permits some horizontal growth or shrinkage of the card due to thermal forces.

38. The connector of claim 23 wherein at least one housing includes a second cam support means located on an opposite, parallel side of the one housing relative to the other cam support means thereon so that a third housing may be mounted on the circuit board parallel to the one housing to define a second circuit card receiving slot and thereby provide the basis for two connectors, side by side, with each connector interconnecting both sides of two circuit cards to the circuit board.

39. An electrical connector for electrically connecting conductive members of a first circuit board to conductive members of a second circuit board, comprising:
    housing means for mounting onto the first circuit board and having a board-receiving space;
    cam means movably mounted in said housing means;
    means provided by said housing means and said cam means enabling said cam means to move parallel to said board-receiving space and laterally relative to said board-receiving space;
    cam follower means mounted on said cam means;
    means provided by said cam follower means and said housing means permitting said cam follower means to move towards and away from said board-receiving space but preventing said cam follower means from moving parallel along said board-receiving space as said cam means moves parallel and laterally with respect to said board-receiving space;
    cooperating means on said cam means and on said cam follower means for moving said cam follower means away from the circuit board on which said housing means may be mounted as said cam means moves in said housing means; and
    flexible circuit means having a first section including first contact means for electrical engagement with the conductive members of the first circuit board and a second section mounted on said cam follower means and including second contact means for electrical engagement with the conductive members of the second circuit board when an edge of the second circuit board is inserted into the board-receiving space and said cam means moves said cam follower means towards said board-receiving space.

40. The electrical connector of claim 39 further including additional cooperating means on said cam means and on said cam follower means for moving said cam follower means towards the circuit board on which said housing means may be mounted as said cam means moves in said housing means.

41. The electrical connector of claim 40 further including keying means mounted on said housing means for engagement with the second circuit board which may be in said board-receiving space to locate the second circuit board in a predetermined position relative to said housing means.

42. The electrical connector of claim 41 further including cam support means in said housing means for supporting said cam means.

43. The electrical connector of claim 42 further including biasing means positioned between said cam means and cam follower means for resiliently biasing said cam follower means laterally away from said cam means and towards said board-receiving space.

44. The electrical connector of claim 43 wherein said cam follower means includes side walls and a base wall to define a channel.

45. The electrical connector of claim 44 wherein said cam means includes a rail which is slidably received in said channel in said cam follower means.

46. The electrical connector of claim 45 further including engaging means on said keying means which are engageable by said cam means for driving said keying means into the board-receiving space upon said cam means being moved in said housing means.

47. The electrical connector of claim 46 wherein said biasing means includes a compressible cantilever beam on a plate with said beam extending obliquely therefrom.

* * * * *